United States Patent
Ionov et al.

(10) Patent No.: US 6,537,918 B2
(45) Date of Patent: *Mar. 25, 2003

(54) METHOD FOR ETCHING SILICON OXYNITRIDE AND DIELECTRIC ANTIREFLECTION COATINGS

(75) Inventors: Pavel Ionov, Sunnyvale, CA (US); Sung Ho Kim, Campbell, CA (US); Dean Li, Taipei (TW); Chun Yan, Santa Clara, CA (US); James Chang Wang, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/920,251

(22) Filed: Jul. 31, 2001

(65) Prior Publication Data

US 2002/0016078 A1 Feb. 7, 2002

Related U.S. Application Data (63) Continuation of application No. 09/317,655, filed on May 24, 1999, now Pat. No. 6,291,356, which is a continuation-in-part of application No. 08/986,911, filed on Dec. 8, 1997, now Pat. No. 6,013,582.

(51) Int. Cl.$^7$ ............................................. H01L 21/302
(52) U.S. Cl. ....................... 438/710; 438/714; 438/724
(58) Field of Search ................................. 438/710, 714, 438/717, 718, 720, 723, 724, 738, 743, 744; 216/37, 41, 47

(56) References Cited

U.S. PATENT DOCUMENTS

| | | | |
|---|---|---|---|
| 4,687,543 A | 8/1987 | Bowker ....................... | 156/643 |
| 4,758,305 A | 7/1988 | Bonifield et al. ........... | 156/643 |
| 5,034,348 A | 7/1991 | Hartswick et al. .......... | 437/200 |

(List continued on next page.)

FOREIGN PATENT DOCUMENTS

| | | | |
|---|---|---|---|
| EP | 0470707 | 2/1992 | ......... H01L/21/027 |
| EP | 0644582 | 3/1995 | ........... H01L/21/28 |

OTHER PUBLICATIONS

S. Arai et al., "Deposition in Dry–Etching Gas Plasmas", *Jpn. J. Appl. Phys.*, vol. 31, Pt. 1, No. 6B, pp. 2011–2019 (1992).

W. Lee et al., "Fabrication of 0.06 μm Poly–Si Gate using DUV Lithography with a Designed SiON Film as an ARC and Hardmask", *1997 Symposium on VLSI Technology Digest of Technical Papers*, XP–002096577, pp. 131–132 (1997).

Y. Ye et al., "0.35–Micron and Sub–0.35–Micron Metal Stack Etch in a DPS Chamber—DPS Chamber and Process Characterization", *Electrochemical Society Proceedings*, vol. 96–12, pp. 222–233 (1996).

*Primary Examiner*—Benjamin L. Utech
*Assistant Examiner*—Kin-Chan Chen
(74) *Attorney, Agent, or Firm*—Shirley L. Church; Joseph Bach (57) ABSTRACT

A method for plasma etching a semiconductor film stack. The film stack includes at least one layer comprising silicon oxynitride. The method includes etching the silicon oxynitride-comprising layer using an etchant gas mixture comprising chlorine and at least one compound containing fluorine and carbon. The atomic ratio of fluorine to chlorine in the etchant gas ranges between about 3:1 and about 0.01:1; preferably, between about 0.5:1 and about 0.01:1; most preferably, between about 0.25:1 and about 0.1:1. The etchant gas forms a fluorine-comprising polymer or species which deposits on exposed surfaces adjacent to the silicon oxynitride-comprising layer in an amount sufficient to reduce the etch rate of an adjacent material (such as a photoresist) while permitting the etching of the silicon oxynitride-comprising layer.

15 Claims, 5 Drawing Sheets

U.S. PATENT DOCUMENTS

| | | | |
|---|---|---|---|
| 5,186,718 A | 2/1993 | Tepman et al. | 29/25.01 |
| 5,269,879 A | 12/1993 | Rhoades et al. | 156/643 |
| 5,275,692 A * | 1/1994 | Barkanic | 216/37 |
| 5,310,626 A | 5/1994 | Fernandes et al. | 430/327 |
| 5,350,488 A | 9/1994 | Webb | 156/643 |
| 5,356,515 A | 10/1994 | Tahara et al. | 156/643 |
| 5,441,914 A | 8/1995 | Taft et al. | 437/189 |
| 5,468,656 A | 11/1995 | Shieh et al. | 437/23 |
| 5,472,829 A | 12/1995 | Ogawa | 430/325 |
| 5,482,817 A | 1/1996 | Dichiara et al. | 430/271.1 |
| 5,514,247 A | 5/1996 | Shan et al. | 156/643.1 |
| 5,525,542 A | 6/1996 | Maniar et al. | 437/186 |
| 5,539,249 A | 7/1996 | Roman et al. | 257/649 |
| 5,633,210 A | 5/1997 | Yang et al. | 438/669 |
| 5,635,338 A | 6/1997 | Joshi et al. | 430/325 |
| 5,639,687 A | 6/1997 | Roman et al. | 437/186 |
| 5,677,111 A | 10/1997 | Ogawa | 430/313 |
| 5,707,486 A | 1/1998 | Collins | 156/643.1 |
| 5,710,067 A | 1/1998 | Foote et al. | 437/238 |
| 5,710,073 A | 1/1998 | Jeng et al. | 438/239 |
| 5,733,712 A | 3/1998 | Tanaka et al. | 430/314 |
| 5,741,396 A * | 4/1998 | Loewenstein | 216/79 |
| 5,767,018 A | 6/1998 | Bell | 438/696 |
| 5,924,000 A * | 7/1999 | Linliu | 438/592 |
| 6,013,582 A * | 1/2000 | Ionov et al. | 216/37 |
| 6,071,372 A * | 6/2000 | Ye et al. | 118/723 I |
| 6,291,356 B1 * | 9/2001 | Ionov et al. | 438/710 |
| 6,313,034 B1 * | 11/2001 | Pan et al. | 438/237 |

* cited by examiner

METHOD FOR ETCHING SILICON OXYNITRIDE AND DIELECTRIC ANTIREFLECTION COATINGS

This application is a continuation application of application Ser. No. 09/317,655, filed May 24, 1999, now U.S. Pat. No. 6,291,356, which is a continuation-in-part of application Ser. No. 08/986,911, filed Dec. 8, 1997, now U.S. Pat. No. 6,013,582.

BACKGROUND OF THE INVENTION

1. Field of Invention

The present invention pertains to a method of etching silicon oxynitride and other oxygen-containing materials. Silicon oxynitride is primarily used as an antireflective coating (ARC) and is often referred to as a "dielectric ARC". Silicon oxynitride is frequently used in combination with deep ultraviolet (DUV) photoresists.

2. Brief Description of the Background Art

In the field of semiconductor device fabrication, DUV photoresists have been developed which take advantage of shorter wavelengths of ultraviolet radiation to enable the patterning of smaller electronic and optical devices than possible with traditional, or so called I-line, photoresists. Generally, the photoresist is applied over a stack including layers of various materials to be patterned in subsequent processing steps. Some of the layers in the stack are consumed during the process of patterning underlying layers which become part of the functioning device. To take advantage of the spacial resolution of the photoresist, it is necessary to use an antireflective coating (ARC) layer underlying the photoresist in order to suppress reflection off other layers in the stack during photoresist exposure. Thus, the ARC layer enables patterning of the photoresist to provide an accurate pattern replication.

Though the most commonly used ARC material is titanium nitride, a number of other materials have been suggested for use in combination with DUV photoresists. For example, U.S. Pat. No. 5,441,914, issued Aug. 15, 1995 to Taft et al., describes the use of a silicon nitride antireflective layer, while U.S. Pat. No. 5,525,542, issued Jun. 11, 1996 to Maniar et al., discloses the use of an aluminum nitride antireflective layer. U.S. Pat. No. 5,539,249, issued Jul. 23, 1996 to Roman et al., describes the use of an antireflective layer of silicon-rich silicon nitride.

U.S. Pat. No. 5,635,338, issued Jun. 3, 1997 to Joshi et al., describes a class of silicon-containing materials which display particular sensitivity in the ultraviolet and deep ultraviolet for the formation of patterns by radiation-induced conversion into glassy compounds. Joshi et al. recommend the use of antireflective coatings such as amorphous silicon and an organic plasma polymerized antireflective coating generated from cycloheptatriene.

U.S. Pat. No. 5,633,210, issued May 27, 1997 to Yang et al., discloses the use of an antireflective coating material selected from titanium nitride materials, silicon oxide materials, and silicon oxynitride materials.

Recently, there has been increased interest in the use of silicon oxynitride as an antireflective coating due to its ability to function well in combination with DUV photoresist. Silicon oxynitride typically (but not by way of limitation) has a formula of $SiO_xN_yH_z$, where x ranges from 0 to about 2, y ranges from 0 to about 1, and z ranges from 0 to about 1. By changing the composition of the silicon oxynitride ARC layer, one can control reflection onto the photoresist during imaging of the photoresist layer. When $SiO_xN_yH_z$ is used as an ARC, x, y, and z typically range between about 0.2 and about 0.5.

Silicon oxynitride as an ARC enables efficient suppression of the reflection from underlying layers, while providing superior chemical properties which prevent an undesirable effect, known as photoresist poisoning, in photoresist patterning. Photoresist poisoning refers to reaction of the surface underlying the photoresist with moisture to form amino basic groups ($NH_2^-$) which react with the photogenerated acid which is responsible for the photoresist development. Deactivation of the acid by the amino groups is believed to be responsible for formation of the "foot" (widening of the photoresist line just above the substrate) on some ARC materials, such as titanium nitride.

The present invention addresses details of the application of dry etch techniques for pattern transfer into a silicon oxynitride layer. However, the concepts developed for dry etch of a silicon oxynitride layer have application to the dry etch of other oxygen-containing substrates.

With reference to a silicon oxynitride layer used as an antireflective coating, in such an application, a typical stack of materials for pattern transfer would include (from bottom to top): A substrate, which is a dielectric layer used to separate a metal interconnect layer (to be patterned on plasma etching of the etch stack) from underlying layers of the integrated circuit; a barrier layer, which prevents the diffusion of material between a conductive layer and the substrate; a conductive layer, which is typically aluminum or an alloy thereof; an antireflective coating (ARC) layer, which reduces reflection back into the photoresist during its exposure in the lithography step and allows for better pattern reproduction; and, a photoresist layer, which is imaged to provide the pattern for transfer to underlying layers.

It would then be desirable to have a dry, plasma-based etch process for transfer of the pattern from the developed photoresist through all of the layers within the complete etch stack, including an ARC layer, a conductive layer, and a barrier layer. Etching of a metal-comprising stack is traditionally achieved in a metal etch chamber using etch stacks with ARC layers such as titanium nitride. However, as silicon oxynitride is a dielectric material, its patterning is traditionally reserved for dielectric etch chambers used for etching oxide and nitride. As a result, the substrate is typically moved from one process chamber to another, which lowers the overall productivity of the whole process.

The present invention details a method permitting the etch of a dielectric-comprising ARC layer, such as a silicon oxynitride ARC, in the same chamber as is used for etching the rest of the metal-comprising stack. We have developed a plasma etch process which provides adequate selectivity for etching a silicon oxynitride ARC layer over organic-based photoresists. In addition, we have obtained a good etch rate for a silicon oxynitride ARC layer, while providing excellent pattern transfer through the ARC layer and other layers of a six-layer, metal-comprising stack. Further, the method of the invention solves a series of integration problems stemming from the fact that the chemistry used for etching the silicon oxynitride ARC layer is very different from that used in the metal etch.

SUMMARY OF THE INVENTION

The present invention pertains to a method for plasma etching a semiconductor film stack. The film stack includes at least one layer comprising an oxygen-containing compound. In one preferred embodiment of the method, the chemistry enables the plasma etching of both a layer of oxygen-comprising material and an adjacent or underlying layer of a different material. In another preferred embodiment of the method, the layer of oxygen-comprising material is etched using one chemistry, while the adjacent or underlying layer is etched using another chemistry, but in the same process chamber. Of particular interest is silicon oxynitride, an oxygen-comprising material which functions as an antireflective material.

A preferred embodiment of the method provides for the use of a source of carbon and an appropriate halogen-comprising plasma to achieve selective etch of one oxygen-containing material compared with another material which contains a more limited amount of oxygen.

In a highly preferred embodiment of the invention, a film of silicon oxynitride is plasma etched, and better selectivity of etching is achieved relative to a film of a lower oxygen content material, such as a photoresist, by using a fluorine-comprising plasma. Preferably, the fluorine-comprising plasma also comprises a source of carbon. Examples of plasma feed gases which provide both fluorine and carbon include fluorocarbons such as $CHF_3$, $CF_4$, $CF_3Cl$, $C_2F_4$, $C_2F_6$, and combinations thereof. The fluorocarbon gases may be combined with other gases which increase the halogen content of the plasma, such as $Cl_2$, $F_2$, HF, HCl, $NF_3$, or $SF_6$, for example, but not by way of limitation. The addition of such other gases is helpful in increasing the etch rate of, and in some instances the etch selectivity toward, the silicon oxynitride. When the gas used to increase the halogen content comprises a halogen other than fluorine, such as chlorine, the etch rate of some other stack materials, such as a $TiN_x$ barrier layer, is also increased. The addition of chlorine to a fluorocarbon-containing plasma should enhance etch of such a barrier layer material along with the silicon oxynitride, while the etch of an oxygen-poor material such as a photoresist is suppressed.

We have discovered a preferred combination of plasma etch gases which provides an unexpectedly high etch rate, while providing selectivity toward etching the silicon oxynitride over patterning photoresist. The preferred etchant gas mixture includes chlorine and at least one compound comprising fluorine and carbon. The atomic ratio of fluorine to chlorine in the etchant gas mixture ranges between about 3:1 and about 0.01:1. A ratio of about 3:1 fluorine:chlorine is recommended for high silicon oxynitride to photoresist etch selectivity. It is expected that the use of $CF_4$ rather than $CHF_3$ would require less $Cl_2$ to selectively etch silicon oxynitride and that $CF_4$ alone is likely to be sufficient. Further, since the silicon etch rate is dependent on fluorine rather than chlorine, the use of $CF_4$ should increase the etch rate of silicon oxynitride and may provide an improvement in etch selectivity as compared with $CHF_3$.

A higher chlorine content is recommended when etching both the layer of silicon oxynitride and an underlying layer containing a metal or a refractory metal such as titanium nitride. A preferred etchant gas mixture has an atomic ratio of fluorine to chlorine between about 0.5:1 and about 0.01:1, most preferably, between about 0.25:1 and about 0.1:1.

DETAILED DESCRIPTION OF THE PREFERRED EMBODIMENTS

A method is disclosed for the selective etching of silicon oxynitride and other oxygen-comprising layers on a multi-layered substrate. The method provides for the selective etching of such oxygen-comprising substrates in a halocarbon-comprising etch plasma, and particularly in a fluorocarbon-comprising etch plasma.

We wanted to use silicon oxynitride as an anti-reflective coating in a multi-layered etch structure for the plasma etching of an aluminum conductive layer. To etch the silicon oxynitride, which may include an oxide capping layer, we used a fluorocarbon-comprising plasma. During development of the etching process, we discovered that we could adjust the selectivity of the etch for silicon oxynitride compared to the photoresist used to pattern the multi-layered etch structure (stack) by adjusting the atomic ratio of halogen (e.g., chlorine and/or fluorine) to carbon in the gases supplied to the process chamber.

It appears that the selectivity of silicon oxynitride etch is improved through the formation of a fluorine-comprising polymer. Polymer films derived from carbon and halogens which are present in an etch plasma have been observed to deposit on the surfaces of silicon and silicon oxide during etch processing (see for example, S. Arai et al., *Jap. J Appl. Phys.*, Part 1, Vol. 31, pp. 2011–2019, 1992). We believe that, while the polymer builds up on the surfaces of nonoxygenated materials, slowing down etching on these surfaces, on the surface of silicon oxynitride, the following reaction takes place:

where $(-CF_n-)_w$ is the polymer layer.

This reaction results in consumption of the polymer simultaneously with etching of silicon oxynitride, while producing highly volatile byproducts. These byproducts are later removed as process chamber exhaust.

To maximize the selectivity of the etch, the proper balance of carbon and fluorine in the plasma is achieved by adjusting the flow rates of gases injected into the processing chamber. Such adjustment is usually made by selecting from or combining several options. For example, the plasma feed gas which comprises fluorine and carbon is selected to have a particular carbon to fluorine atomic ratio, where the ratio is adjusted by selection from gases such as $CHF_3$, $CF_4$, $C_2F_4$, $C_2F_6$, or a combination thereof. If polymer formation is not desired, oxygen or another oxidizing agent which binds with carbon to form a volatile compound may be added to the feed gas in order to suppress the formation of polymer. Conversely, whenever polymer formation is desirable, it is preferable that oxygen not be included in the plasma feed gas composition. Alternatively, a gas which serves as a source of carbon, such as CO, may be included in the feed gas when it is desired to increase the polymer formation. It should be mentioned that, if photoresist is present in the etch chamber, its erosion during the plasma etching process produces considerable amounts of carbon, and the composition of the gas feed should be adjusted in accordance with the pattern density of the photoresist, and possibly with the type of photoresist used.

We have achieved a surprising increase in the etch rate of silicon oxynitride by adding an assisting halogen-comprising gas such as $Cl_2$, $F_2$, HF, HCl, or $SF_6$ (preferably $Cl_2$ and $SF_6$ to the fluorocarbon-comprising plasma feed gases. This list of gases can be extended to include other gases which serve as a source of halogen atoms in the plasma. The benefits of using such an assisting gas are two-fold: (1) if etching of silicon oxynitride is carried out in a metal etch chamber (and this is desirable when the silicon oxynitride is used as an ARC layer in a metal stack), such halogen-containing gases are likely to be connected to the etch system for the purpose of metal etch; and (2) the addition of a halogen other than fluorine appears to provide additional flexibility in controlling the etch rates of other materials exposed to the plasma.

For example, the etching of a titanium nitride barrier layer is faster using chlorine than fluorine, and the addition of chlorine to a fluorocarbon-comprising plasma enhances the etching of this material simultaneously with the etching of silicon oxynitride, while the etching of an adjacent photoresist is suppressed due to the presence of polymer or halocarbon species on its surface.

We have discovered a preferred combination of plasma etch gases which provides an unexpectedly high etch rate for silicon oxynitride, while providing selectivity for silicon oxynitride over patterning photoresist. The preferred etchant gas mixture includes chlorine and at least one compound comprising fluorine and carbon. The atomic ratio of fluorine to chlorine in the etchant gas mixture ranges between about 3:1 and about 0.01:1. An atomic ratio of about 3:1 fluorine:chlorine is recommended for high silicon oxynitride selectivity relative to photoresist selectivity. It is expected that the use of $CF_4$ rather than $CHF_3$ would require less $Cl_2$ to selectively etch silicon oxynitride and that $CF_4$ alone is likely to be sufficient. Further, since the silicon etch rate is dependent on fluorine rather than chlorine, the use of $CF_4$ should increase the etch rate of silicon oxynitride and may provide an improvement in selectivity as compared with $CHF_3$.

A higher chlorine content is recommended when etching both the layer of silicon oxynitride and an underlying layer containing a metal or a refractory metal such as titanium nitride. A preferred etchant gas mixture has an atomic ratio of fluorine to chlorine between about 0.5:1 and about 0.0:1, most preferably, between about 0.25:1 and about 0.1:1.

In view of the successful etching of silicon oxynitride, we believe that, in a halocarbon-based etch plasma, it is possible to improve the selectivity of oxygen-comprising layers over adjacent layers which contain substantially less oxygen or no oxygen using the method described above and expanded upon below.

In particular, a carbon source and an appropriate halogen-comprising plasma can be used to achieve selective etching of an oxygen-comprising material compared with a material which contains no oxygen or a substantially reduced amount of oxygen. We believe that such selectivity is achieved through polymer formation on surfaces exposed to halocarbon plasma. The following reaction between an oxygen-rich substrate and a polymer film or a halocarbon-comprising species on the surface of the film applies:

where $(-CX_n-)_y$ is the polymer layer or halogen-comprising species; X is a halogen, such as F, Cl, Br, or I; $RO_m$ is an oxygen-containing material, such as $SiO_xN_yH_z$, $SiO_2$, or $TiO_xN_y$; $wX_k$ is the halogenated etch byproduct, such as $SiF_4$, $TiF_4$, or $TiCl_4$; and (s) and (g) represent a solid and a gas, respectively.

The overall outcome of this reaction is that part of the polymer (or halocarbon-comprising species) reacts with the substrate material to form gaseous products that can be subsequently removed from the plasma processing chamber with the exhaust gases. Thus, an oxygen-comprising material is etched, while the etching of a material which does not contain oxygen is hindered by polymer build up. By choosing the appropriate halogen so that the halogenated byproducts $wX_k$ have the highest possible vapor pressure, the best results can be achieved.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to "a conductive material" includes metals such aluminum, copper, platinum, iridium, rubidium, and combinations and alloys thereof, as well as other conductive materials which would be suitable in the application described.

Specific terminology of particular importance to the description of the present invention is defined below.

The term "aluminum" includes alloys of aluminum of the kind typically used in the semiconductor industry. Such alloys include aluminum-copper alloys and aluminum-copper-silicon alloys, for example. Typically, such alloys of aluminum comprise about 0.5% copper. In addition, as is known in the art, aluminum may exhibit a surface layer of aluminum oxide.

The term "antireflective coating", "antireflective layer", or "ARC" includes materials which are applied to a surface to reduce its reflection of electromagnetic radiation.

The term "decoupled plasma source" or "DPS" refers to a plasma etch apparatus with separate controls for the inductive coupling of RF power, which controls plasma density, (source power) and the bias power, which controls ion bombardment energy of the substrate surface.

The term "feature" refers to metal lines, trenches, and openings in a dielectric layer, and other structures which make up the topography of a substrate surface. Feature size often refers to the size of the smallest feature on the wafer.

The term "ion bombardment" refers to the collision of ions with a surface. The ions are accelerated toward the surface by electric fields in the vicinity of a surface exposed to a plasma.

The term "plasma" refers to a partially ionized gas containing an approximately equal number of positive and negative charges, as well as some other number of non-ionized gas species.

The term "plasma feed gas" refers to the process gas from which the plasma is created.

The term "selectivity" is used to refer to: a) a ratio of etch rates of two materials; and b) a condition achieved during etch when etch rate of one material is increased in comparison with another material. Note that typically there are various kinds of materials included in a stack of layers used in an etching process.

The term "source power" refers to the power that is responsible for sustaining the plasma by providing a major portion of the energy to ionize the neutral species in the chamber.

The term "stack" or "etch stack" or "film stack" refers to a collection of layers of different materials deposited one over the other, at least a portion of which are etched during an etching process. A "metal stack" refers to a "stack" which, upon completion of a metal etch process, becomes a metal-comprising feature on a substrate.

The term "substrate" includes semiconductor materials, glass, ceramics, polymeric materials, and other materials of use in the semiconductor industry.

The term "vertical profile" refers to a feature profile wherein a cross-section of the feature exhibits side walls which are perpendicular to the major plane of the substrate. Alternatively, a "positive profile" is one wherein the width of the cross-section of the feature is larger at the surface on which the feature stands than at a distance away from the surface.

II. An Apparatus for Practicing the Invention

The preferred embodiment etch processes described herein were carried out in a CENTURA® DPS™ Integrated Processing System, available from Applied Materials, Inc. of Santa Clara, Calif. The system is shown and described in U.S. Pat. No. 5,186,718, the disclosure of which is hereby incorporated by reference. This equipment included a decoupled plasma source of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The plasma processing chamber enables the processing of a 200 mm diameter silicon wafer.

Figure 5:
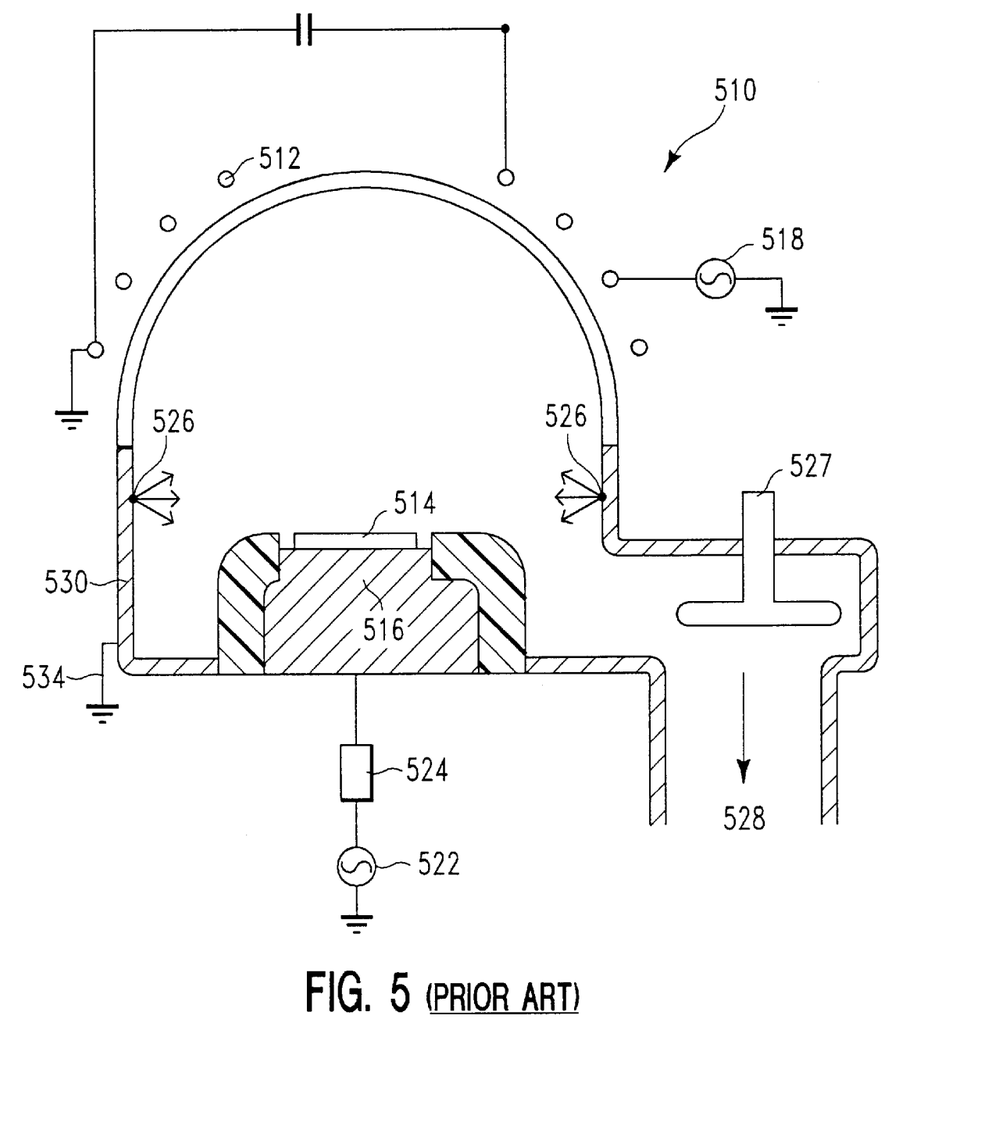
FIG. 5 shows a plasma processing apparatus of the kind used to perform the etch processes described herein.

A schematic of the processing chamber is shown in FIG. 5, which shows an etching process chamber 510, which is constructed to include at least one inductive coil antenna segment 512 positioned exterior to the etch process chamber 510 and connected to a radio frequency (RF) power generator 518 (source power generator with a frequency tunable around 2 MHz for impedance matching at different plasma conditions). Interior to the process chamber is a substrate 514 support pedestal (cathode) 516, which is connected to an RF frequency power generator 522 (bias power generator of frequency fixed at 13.56 MHz) through an impedance matching network 524, and a conductive chamber wall 530 which serves as the electrical ground 534.

The semiconductor substrate 514 is placed on the support pedestal 516 and gaseous components are fed into the process chamber through entry ports 526. A plasma is ignited in process chamber 510 by applying RF powers 518 and 522. Pressure interior to the etch process chamber 510 is controlled using a vacuum pump (not shown) and a throttle valve 527 situated between process chamber 510 and the vacuum pump. The temperature on the surface of the etch chamber walls is controlled using liquid-containing conduits (not shown) which are located in the walls of the etch chamber 510. The temperature of the semiconductor substrate is controlled by stabilizing the temperature of the support pedestal and flowing helium gas in the channels formed by the back of the substrate and grooves (not shown) on the pedestal 516 surface. The helium gas is used to facilitate heat transfer between the substrate and the pedestal. During the etch process, the substrate surface is gradually heated by the plasma to a steady state temperature which is approximately 25° C. –40° C. higher than the substrate support platen temperature, depending on the process conditions. It is estimated that the substrate surface temperature was typically around 75° C. during most of our experiments. The surface of the etching chamber 510 walls was maintained at about 80° C. using the cooling conduits previously described.

III. Examples of Etching Silicon Oxynitride

Three sets of initial experiments were performed. First, the basic effect of etch chemistry was evaluated by etching unpatterned silicon oxynitride and unpatterned I-line photoresist wafers, and the etch rates were compared to estimate the selectivity. (The photoresist and silicon oxynitride were not simultaneously present in the plasma.) $CHF_3$, $Cl_2$, $SF_6$, $BCl_3$, and combinations thereof were evaluated in this experiment. The etch rates obtained are provided in Table 1, below. The etch conditions were as follows: the plasma source power was 1400 W; the bias power was 130 W; the process chamber pressure was 13 mTorr; the substrate support platen temperature was 45° C.; and the support platen back side helium pressure was 10 Torr, with a typical leak of 3–6 sccm. Etching was carried out for 40 seconds. This experiment indicated that $CHF_3$ and $Cl_2$ used together provided the most promising combination of selectivity and etch rate.

TABLE 1

Unpatterned $SiO_xN_y$ and Photoresist Etch Rates and Selectivity as a Function of Etch Gas Feed Composition

| $Cl_2$ (sccm) | $BCl_3$ (sccm) | $SF_6$ (sccm) | $CHF_3$ (sccm) | $SiO_xN_y$ ER (Å/min) | PR ER (Å/min) | Select |
|---|---|---|---|---|---|---|
| 100 | — | — | — | 1222 | 2820 | 0.443 |
| — | 100 | — | — | 724 | 643 | 1.13 |

TABLE 1-continued

Unpatterned $SiO_xN_y$ and Photoresist Etch Rates and Selectivity as a Function of Etch Gas Feed Composition

| $Cl_2$ (sccm) | $BCl_3$ (sccm) | $SF_6$ (sccm) | $CHF_3$ (sccm) | $SiO_xN_y$ ER (Å/min) | PR ER (Å/min) | Select |
|---|---|---|---|---|---|---|
| — | — | 100 | — | 2625 | 6048 | 0.434 |
| — | — | — | 50 | 2112 | 1467 | 1.44 |
| 50 | — | — | 50 | 2884 | 2512 | 1.15 |
| — | 50 | — | 50 | 1789 | 1564 | 1.14 |
| — | — | 50 | 50 | 2713 | 4575 | 0.593 | where ER is etch rate; PR is photoresist; and Select is selectivity.

In the second set of initial experiments, we pattern-etched a silicon oxynitride layer having a thickness of about 3500 Å which had been applied over a silicon dioxide surface. The pattern was lines and spaces having a feature size down to about 0.25 μm, which was transferred from a patterned layer of DUV photoresist (Shipley UV-5, having a thickness of about 6500–7000 Å). The substrate was then examined using a scanning electron microscope to determine the pattern profile and to estimate the etch rates and selectivity. The details are provided in Tables 2 and 3. It was discovered that, due to the increased amount of carbon released into the plasma from the photoresist surface, silicon oxynitride could not be etched in pure $CHF_3$ under the process conditions used (basically the same conditions described above for the initial experiment). The etch rate had dropped by a factor of about three in the area of the substrate at a distance away from the photoresist lines (open area), and by a factor of about ten in between the lines, as compared to the etch rate of unpatterned silicon oxynitride. This situation was subsequently corrected by adding $Cl_2$ to the plasma gas feed. In particular, the $Cl_2$ added made up from about 33% to about 75% of the total volumetric gas flow.

TABLE 2

Process Conditions for the Pattern Etch of Silicon Oxynitride

| Substrate Number | $CHF_3$/ $Cl_2$/ $BCl_3$ (sccm) | Pressure (mTorr) | Source Power (W) | Bias Power (W) | Support Pedestal Temp. (° C.) | Time (sec) | Comments |
|---|---|---|---|---|---|---|---|
| 1 | 50/0/0 | 14 | 1400 | 80 | 45 | 60 | Low etch rate |
| 2 | 50/0/0 | 12 | 1400 | 100 | 45 | 180 | Low etch rate |
| 3 | 50/50/0 | 12 | 1400 | 100 | 45 | 120 | Drastic Rate Increase |
| 4 | 50/50/0 | 12 | 1400 | 100 | 45 | 60 | Looks Good |
| 5 | 50/25/0 | 12 | 1400 | 100 | 45 | 60 | No Large Change |
| 6 | 50/12/0 | 12 | 1400 | 100 | 45 | 60 | |
| 7 | 50/25/0 | 12 | 1400 | 130 | 45 | 45 | |
| 8 | 50/25/0 | 12 | 1100 | 100 | 45 | 60 | |
| 9 | 50/25/0 | 15 | 1400 | 100 | 45 | 45 | |
| 10 | 40/20/0 | 12 | 1400 | 100 | 45 | 60 | |
| 11 | 50/25/0 | 12 | 1400 | 100 | 30 | 60 | Positive Profile |
| 12 | 20/20/0 | 12 | 1400 | 100 | 45 | 60 | Slt. Pos. Profile |
| 13 | 20/60/0 | 12 | 1400 | 100 | 45 | 60 | |
| 14 | 20/0/60 | 12 | 1400 | 100 | 45 | 60 | Vry. Pos. Profile |

A positive profile is one in which a line is wider at the bottom than at the top, so that the included angle at the base of the line is greater than 90°. Helium backside pressure was 10 Torr throughout all trial runs.

TABLE 3

Etch Rate and Selectivity of Pattern Etching Silicon Oxynitride

| SUBSTRATE NUMBER* | PROCESS CHANGE | ETCH RATE** $SiO_xN_y$ (Å/MIN) | PR Loss TOP SHOULDER (Å/MIN) | | SELECTIVITY*** (OPEN/TOP) |
|---|---|---|---|---|---|
| 5 | BASE-LINE | 3100 | 2500 | 3100 | 1.2 ± 0.1 |
| 6 | –CL2 | 2600 | 2300 | 2900 | 1.0 ± 0.1 |
| 7 | +BIAS | 3450 | 3300 | 4200 | 1.0 ± 0.1 |
| 8 | –SOURCE | 2900 | 2900 | 3500 | 1.0 ± 0.1 |
| 9 | +PRESSURE | 2900 | 2700 | 3400 | 1.1 ± 0.1 |
| 10 | –FLOW | 2800 | 2800 | 3200 | 1.0 ± 0.1 |
| 11 | –TEMP | 2800 | 2400 | 3000 | 1.2 ± 0.1 |
| 12 | –FLOW | 1700 | 2500 | 3400 | 0.68 ± 0.08 |
| 13 | –$CHF_3$ + $CL_2$ | 2100 | 3300 | 3800 | 0.64 ± 0.08 |
| 14 | $CHF_3$ + $BCL_3$ | 1300 | 2000 | 3100 | 0.65 ± 0.0 |

*Substrate numbers correspond with those in Table 2.
**Etch rate in the open area.
***Ratio of the open area etch rate to the photoresist loss rate at the top in a 0.25 μm/0.25 μm (line/space) line array.

In the third set of initial experiments, a full metal stack, which included an aluminum metal layer and titanium nitride barrier layers upon a silicon wafer substrate, was etched. The etch profiles were examined using a scanning electron microscope. The details for the third set of initial experiments are given in the Examples One and Two, below.

Figure 1:
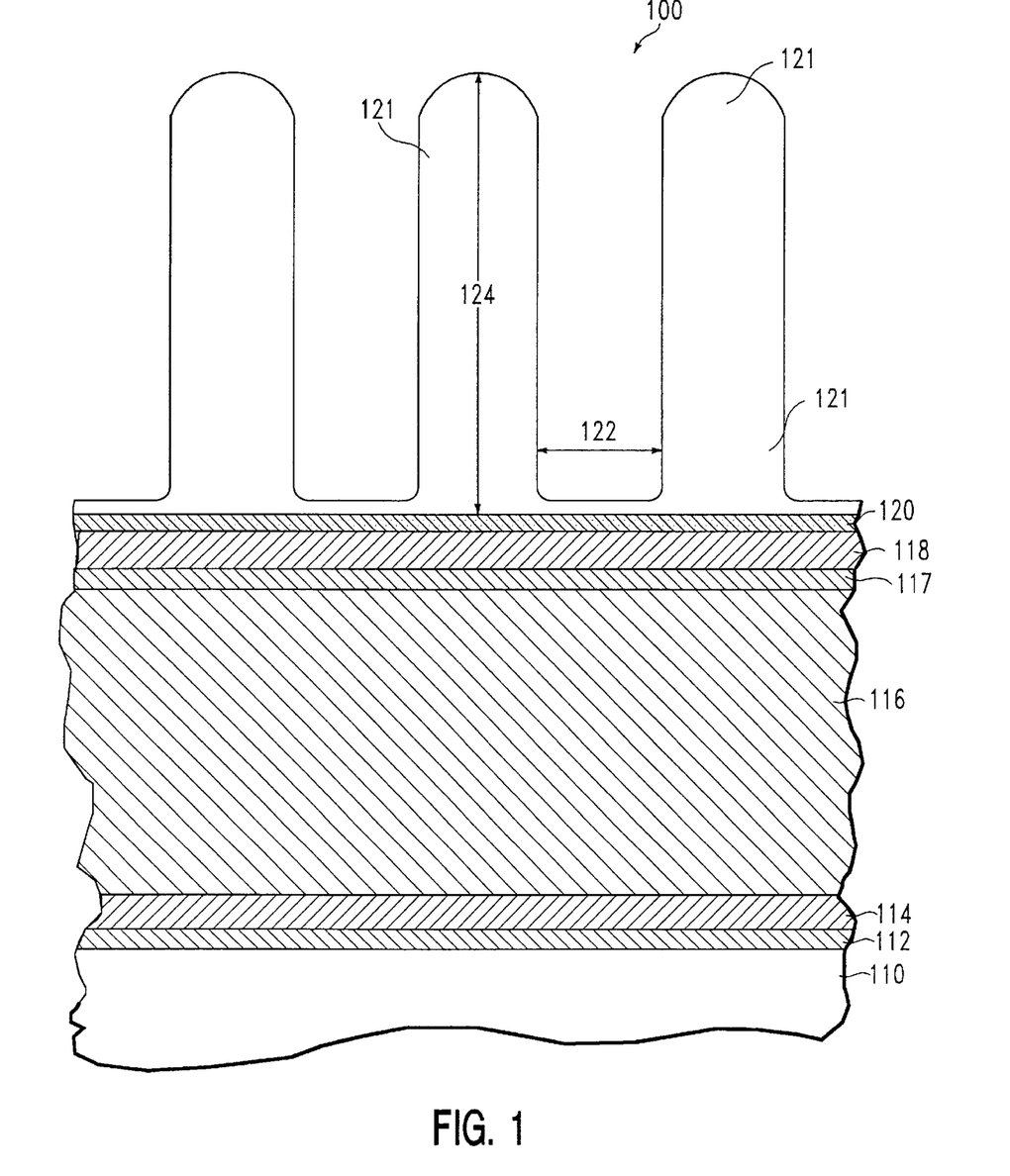
FIG. 1 shows a schematic of the cross-sectional view of a preferred embodiment metal etch stack 100 incorporating (from top to bottom) a patterned DUV photoresist 121, a layer of silicon oxynitride 120 as the ARC layer, a second titanium nitride barrier layer 118, a second titanium wetting layer 117, an aluminum alloy layer 116, a first titanium nitride barrier layer 114, and a first titanium wetting layer 112, all deposited on a substrate 110 which comprises a layer of silicon dioxide (typically overlying a silicon wafer surface, which is not shown).

FIG. 1 illustrates a typical preferred embodiment etch stack 100 for patterning an aluminum conductive layer to feature sizes down to 0.25 μm or less using a DUV photoresist as a patterning means. In particular, the substrate 110 is a layer of silicon dioxide overlying a silicon wafer surface (not shown). The barrier layer is a bilayer composed of a 300 Å thick wetting layer of titanium 112, followed by a 500 Å thick barrier layer of titanium nitride 114. Overlying titanium nitride barrier layer 114 is a 5200 Å thick layer 116 of aluminum alloy containing 0.5% copper. Overlying aluminum alloy layer 116 is a second 300 Å thick wetting layer of titanium 117, followed by a 500 Å thick barrier layer of titanium nitride 118. Overlying second titanium nitride barrier layer 118 is a layer of silicon oxynitride 120 having a thickness of about 300 Å. Overlying silicon oxynitride layer 120 is a layer of patterned DUV photoresist 121, where the pattern is lines and spaces, and where the lines and spaces have a varying width 122 of about 0.2 μm and larger, and a height 124 of about 0.7 μm (7000 Å). In the preferred embodiments described herein, the DUV photoresist was UV-5, manufactured by Shipley Company (Marlborough, Mass.). We also evaluated a DUV photoresist manufactured by Shin-Estu (Japan), which performed in a similar manner.

EXAMPLE ONE

Figure 2A:
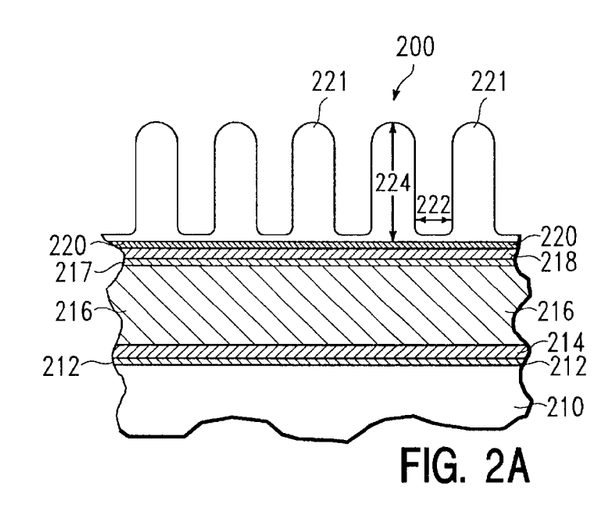
FIGS. 2A–2D illustrate the Example One etch stack cross-sectional view schematic as the etch stack shown in FIG. 1 progresses through a three-step etch process.

This example is for a three-step etch, in which the $SiO_xN_y$ ARC layer is etched in Step 1, the underlying second titanium nitride and titanium layers are etched in Step 2, and the aluminum alloy layer, and underlying first titanium nitride and titanium layers are etched in Step 3. FIG. 2A illustrates the schematic cross-sectional profile of the preferred embodiment stack 200 (the same stack as 100 described with reference to FIG. 1) during the three etching steps.

Figure 2B:
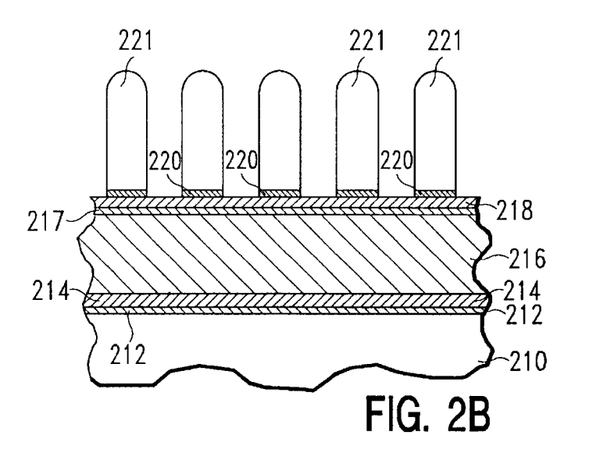

FIG. 2B shows the schematic of the cross-sectional profile of the etch stack after the first etch step, in which the pattern is transferred from DUV photoresist layer 221 through silicon oxynitride layer 220, stopping at the upper surface of second titanium nitride layer 218. The etch conditions used to carry out this first etch step were as follows: the source power was 1400 W; the bias power was 100 W; the process chamber pressure was 12 mTorr; the substrate support platen temperature was about 45° C.; the gas flow rates were 50 sccm of $CHF_3$ and 25 sccm of $Cl_2$; and the wafer back side helium pressure was 12 Torr, with a typical leak of 3–6 sccm. The etch time period was 5 seconds.

Figure 2C:
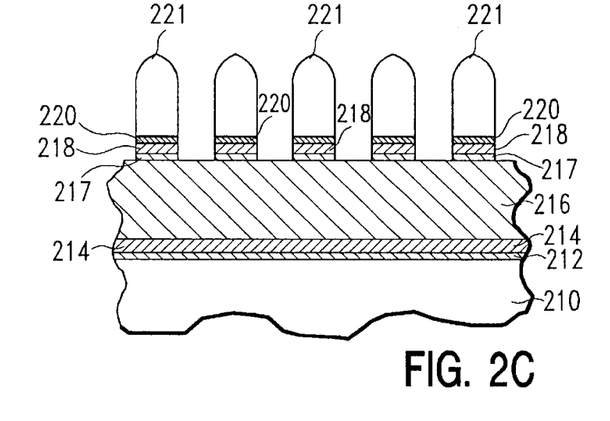

FIG. 2C shows the schematic of the cross-sectional profile of the etch stack after the second etch step in which the pattern is transferred through the second titanium nitride barrier layer 218 and second titanium wetting layer 217, stopping at the upper surface of aluminum layer 216. The etch conditions used to carry out this second etch step were the same as in the first step, except that the bias power was 50 W, and the gas flow rates were 15 sccm of $CHF_3$ and 90 sccm of $Cl_2$. The etch time period was 12 seconds.

Figure 2D:
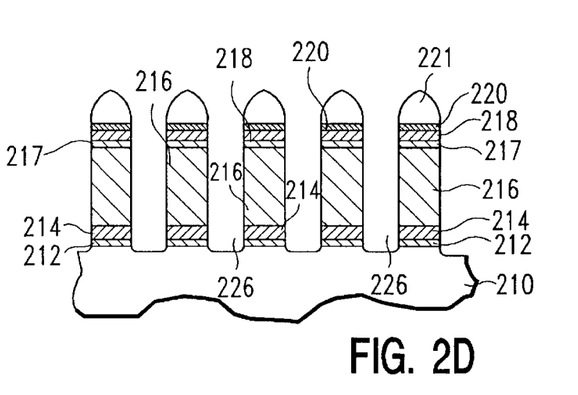

FIG. 2D shows the schematic of the cross-sectional profile of the stack after the third etch step, in which the pattern is transferred through the aluminum layer 216, the first titanium nitride barrier layer 214, and the first titanium wetting layer 212, stopping with a slight over-etch 226 into the top of silicon dioxide layer 210. The etch conditions used to carry out this third etch step were as follows: The plasma source power was 1100 W; the bias power was 130 W; the process chamber pressure was 8 mTorr; the substrate support platen temperature was 45° C., the gas flow rates were 5 sccm of $CHF_3$, 80 sccm of $Cl_2$, and 40 sccm of $BCl_3$; and the wafer back side helium pressure was 12 Torr, with a typical leak of 3–6 sccm. The etch was carried out for as long as the end point signal at 396 nm (aluminum and titanium lines) was above the background level, plus another 10 seconds.

EXAMPLE TWO

Figure 3A:
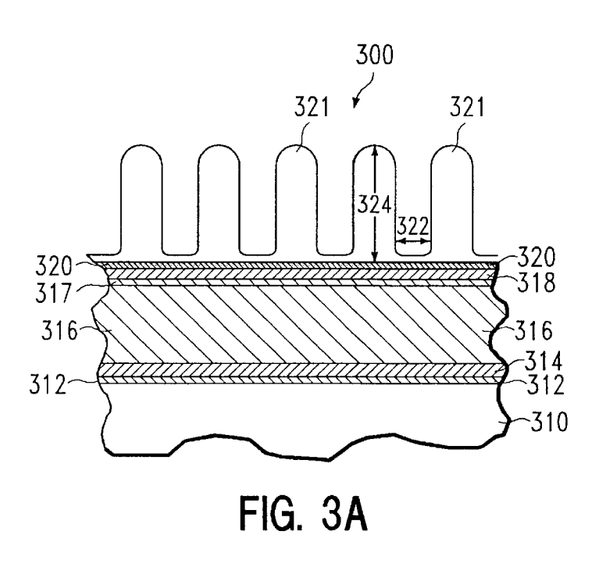
FIGS. 3A–3C illustrate the Example Two and Three etch stack cross-sectional view schematic as the etch stack shown in FIG. 1 progresses through the etch process, including one step for etching the silicon oxynitride 320, second titanium nitride barrier layer 318, and second titanium wetting layer 317, and at least one metal etch step for etching the aluminum layer 316, first titanium nitride barrier layer 314, and first titanium wetting layer 312.

This Example is for a two-step etch, in which the $SiO_xN_y$ ARC layer and the underlying titanium nitride and titanium layers are etched in Step 1, and the aluminum layer and titanium nitride and titanium layers which underlie the aluminum layer are etched in Step 2. FIG. 3A illustrates the schematic cross-sectional profile of the preferred embodiment etch stack 300 (the same stack as 100 described with reference to FIG. 1).

Figure 3B:
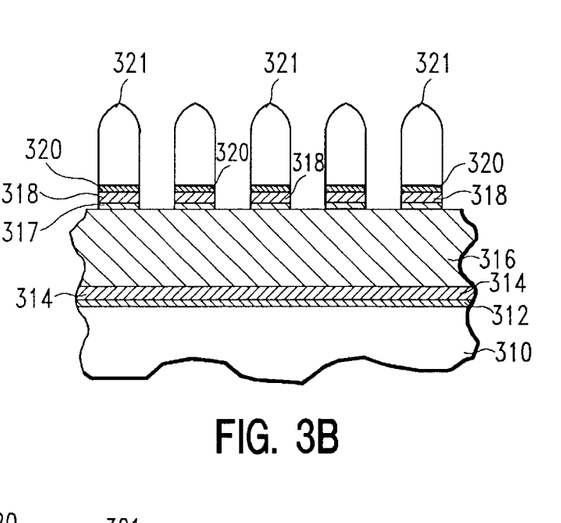

FIG. 3B shows the schematic of the cross-sectional profile of the etch stack 300 after the first etch step, in which the pattern is transferred from DUV photoresist layer 321 through silicon oxynitride layer 320, second titanium nitride barrier layer 318, and second titanium wetting layer 317, stopping at the upper surface of aluminum layer 316. The etch conditions used to carry out this first etch step were as follows: the source power was 1400 W; the bias power was 70 W; the process chamber pressure was 12 mTorr; the substrate support pedestal temperature was 45° C.; the gas flow rates were 20 sccm of $CHF_3$ and 60 sccm of $Cl_2$; and the wafer back side helium pressure was 12 Torr, with a typical leak of about 3–6 sccm. The etch time period was 20 seconds.

Figure 3C:
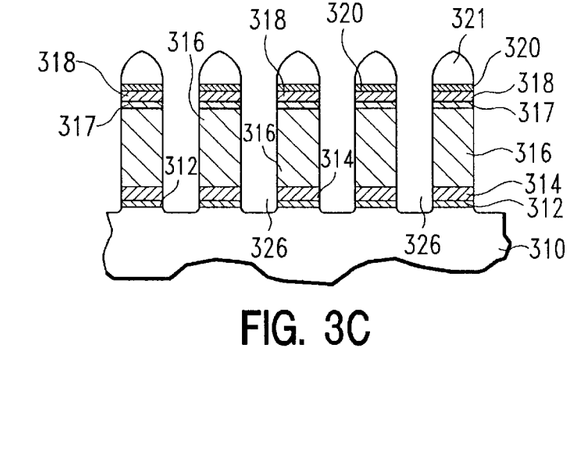

FIG. 3C shows the schematic of the cross-sectional profile of the etch stack 300 after the second etch step in which the pattern is transferred through aluminum layer 316, first titanium nitride layer 314, and first titanium layer 312, stopping with a slight over-etch 326 into silicon dioxide layer 310. The etch conditions used to carry out this second etch step were as follows: the plasma source power was 1000 W; the bias power was 130 W; the process chamber pressure was 8 mTorr; the substrate support platen temperature was 45° C., the gas volumetric flow rates were 5 sccm of $CHF_3$, 80 sccm of $Cl_2$, and 40 sccm of $BCl_3$; and the wafer back side helium pressure was 12 Torr, with a typical leak of 3–6 sccm. The etch was carried out for as long as the end point signal at 396 nm (aluminum and titanium lines) was above the background level, plus another 10 seconds.

IV. Application of the Method to Aluminum Etching

In Example One, an atomic ratio of fluorine:chlorine of 3:1 was used in the silicon oxynitride etch step; in Example Two, the atomic ratio of fluorine:chlorine during the silicon oxynitride etch was 0.5:1. The increased concentration of chlorine used in Example Two (as compared with Example One), sacrifices the selectivity toward etching silicon oxynitride relative to other materials during the silicon oxynitride etch, to enhance etching of other materials such as titanium nitride.

When silicon oxynitride is used as an ARC layer (as in Examples One and Two), the silicon oxynitride is typically deposited as a thin layer, having a typical thickness within the range of about 300 Å to about 600 Å. Since the silicon oxynitride layer typically represents only a small fraction (within the range of about 3% to about 12%) of the total film stack thickness that is being etched, the selectivity toward etching silicon oxynitride relative to photoresist during the silicon oxynitride etch can be easily sacrificed in favor of other process considerations, without having a significant effect on the photoresist loss during the entire etch process. Considering the small loss of photoresist during silicon oxynitride etch, sacrifice of selectivity during this step is well-justified when this permits omitting a separate processing step (to etch the titanium nitride and titanium layers underlying the silicon oxynitride).

There are two more considerations which lead us to favor a lower fluorocarbon content in the plasma feed gas: (1) polymer residue on the etched features, and (2) deposition on the chamber wall. We have discovered that polymer deposition on the etched semiconductor feature sidewall (which remains on the wafer after etch) and polymer deposition on the etch chamber wall during the silicon oxynitride etch step both tend to increase with increased fluorocarbon gas concentrations. We have further discovered that the semiconductor feature sidewall residue remaining after using a "high" $CHF_3$ flow (such as that described in Example One, above) may be difficult to remove in a conventional etch/strip/solvent dip process sequence. Lowering the concentration of the fluorine and carbon-comprising gas in the plasma feed gas alleviates this problem.

Another, particularly important, consideration in favor of lowering the concentration of the fluorine and carbon-comprising gas in the etchant feed gas mixture is the reduction of fluorine-containing deposits on interior process chamber surfaces after the silicon oxynitride etch. Because the remainder of the film stack is etched in the same chamber immediately after etching the silicon oxynitride layer, the fluorine-containing deposits from the silicon oxynitride etching step may have a negative effect on subsequent etch steps. Specifically, fluorine-containing deposits on the process chamber surfaces release fluorine during an aluminum etch step; this has a deleterious effect on the process. Since aluminum forms stable, nonvolatile compounds with fluorine, the presence of fluorine has a strong effect on aluminum etch, resulting in a dramatic change in etch profile, lower etch rate (sometimes even complete etch stop), as a well as a reduction in selectivity of etching aluminum relative to photoresist.

In addition, changes in the composition of the deposits on process chamber surfaces may lead to an increase in the required cleaning frequency for the process chamber, due to factors such as an increase in the number of particles generated during etch. Increased cleaning requirements increase chamber downtime and reduce product throughput, while an increase in the number of particles generated reduces product yield.

However, there are important advantages to having at least a minimal amount (i.e., at least about 1 atomic %) of a fluorine and carbon-comprising gas in the plasma feed gas mixture. These advantages include increased silicon oxynitride etch rate, improved selectivity toward etching the silicon oxynitride relative to the photoresist, and a vertical etch profile of the silicon oxynitride and underlying titanium nitride (if used).

Reducing the process chamber pressure during silicon oxynitride etch has also proven useful in reducing the amount of feature sidewall residue deposited during the silicon oxynitride etch. However, a reduction in process chamber pressure affects other process characteristics as well. A lower process chamber pressure reduces selectivity of etching silicon oxynitride relative to photoresist, increases the amount of faceting, while it tends to produce a more vertical profile. Also, a lower pressure will generally change etch rates and the amount and composition of byproduct build-up on chamber walls. Balancing all of these considerations, we have found that the preferred process chamber pressure for performing silicon oxynitride etch according to the method of the invention ranges from about 2 mTorr to about 20 mTorr; more preferably, about 2 mTorr to about 12 mTorr; most preferably, about 2 mTorr to about 8 mTorr.

Examples Three, Four, and Five, below, which illustrate silicon oxynitride etch conditions, utilize etchant gas compositions and process conditions which were found to provide the best compromise between the factors described above (i.e., polymer deposition on etched feature sidewalls and etch chamber walls, silicon oxynitride etch rate, selectivity toward etching silicon oxynitride relative to photoresist, etch profile) with respect to the etching of an aluminum etch stack. The fluorine and carbon-comprising gas used in Examples Three and Four was $CHF_3$; in Example Five, $CF_4$.

In this Example, the $SiO_xN_y$ ARC layer and the underlying titanium nitride and titanium barrier layers are etched in a single step. The aluminum layer and titanium nitride and titanium layers which underlie the aluminum layer are etched in a multi-step etch process, which typically includes at least two steps—a main etch step and an over-etch step.

This Example can be illustrated using FIGS. 3A, 3B, and 3C, where FIG. 3A illustrates the schematic cross-sectional profile of the preferred embodiment stack 300 (the same stack as 100 described with reference to FIG. 1). In particular, the substrate 310 is a layer of silicon dioxide overlying a silicon wafer surface (not shown). The barrier layer is a bilayer composed of a 150 Å thick layer of titanium 312, followed by a 200 Å thick layer of titanium nitride 314. Overlying titanium nitride barrier layer 314 is a 6500 Å thick layer 316 of aluminum alloy containing 0.5% copper. Overlying aluminum alloy layer 316 is a second 300 Å thick layer of titanium 317, followed by a 700 Å thick layer of titanium nitride 318. Overlying second titanium nitride layer 318 is a layer of silicon oxynitride 320 having a thickness of about 300 Å. Overlying silicon oxynitride layer 320 is a layer of patterned DUV photoresist 321 having a thickness 324 of about 6000 Å, where the pattern is lines and spaces, and where the lines and spaces have a varying width 322 of about 0.25 μm and larger. The DUV photoresist was similar to that used in the initial set of experiments described above.

FIG. 3B shows the schematic of the cross-sectional profile of the etch stack after the first etch step, in which the pattern is transferred from DUV photoresist layer 321 through silicon oxynitride layer 320, second titanium nitride barrier layer 318, and second titanium layer 317, stopping at the upper surface of aluminum layer 316. The etch conditions used to carry out this first etch step were as follows: the source power was 1300 W; the bias power was 80 W; the process chamber pressure was 8 mTorr; the substrate support platen temperature was 35° C.; the gas flow rates were 10 sccm of $CHF_3$ and 70 sccm of $Cl_2$; and the wafer back side helium pressure was 7 Torr, with a typical leak of about 2 to 4 sccm. The etch time was 25 seconds.

FIG. 3C shows the schematic of the cross-sectional profile of the stack after the aluminum etch steps in which the pattern is transferred through aluminum layer 316, first titanium nitride layer 314, and first titanium layer 312, stopping with a slight over-etch 326 into silicon dioxide layer 310. The aluminum etching was performed using $Cl_2$ and $BCl_3$ as the main etchant gases, and using process conditions known in the art for etching aluminum. Nitrogen and argon gases may be used in combination with $Cl_2$ and $BCl_3$ to provide process control.

EXAMPLE FOUR

In this Example, the $SiO_xN_y$ ARC layer and an underlying titanium nitride barrier layer are etched in a single step. The aluminum layer and titanium nitride and titanium layers which underlie the aluminum layer are etched in a multi-step etch process, which typically includes at least two steps—a main etch step and an over-etch step.

Figure 4A:
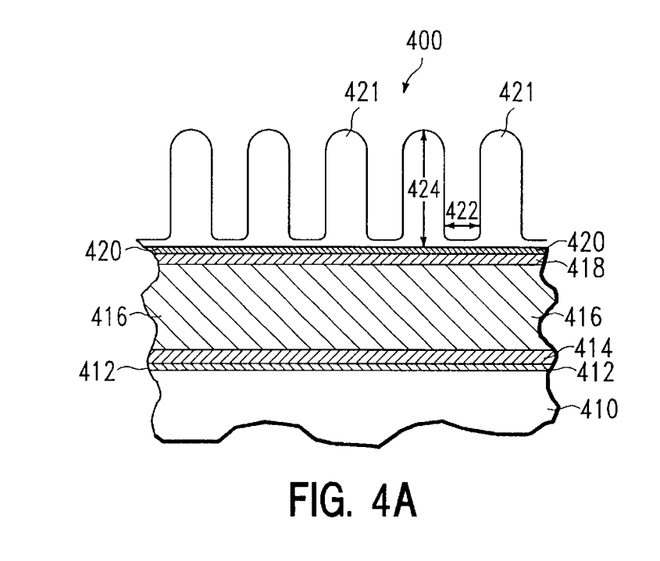
FIG. 4A shows a schematic of a cross-sectional view of a preferred embodiment metal etch stack 400 incorporating (from top to bottom) a patterned DUV photoresist 421, a layer of silicon oxynitride 420 as the ARC layer, a second titanium nitride barrier layer 418, an aluminum alloy layer 416, a first titanium nitride barrier layer 414, and a titanium wetting layer 412, all deposited on a substrate 410 comprising a layer of silicon dioxide (typically overlying a silicon wafer surface which is not shown).
Figure 4B:
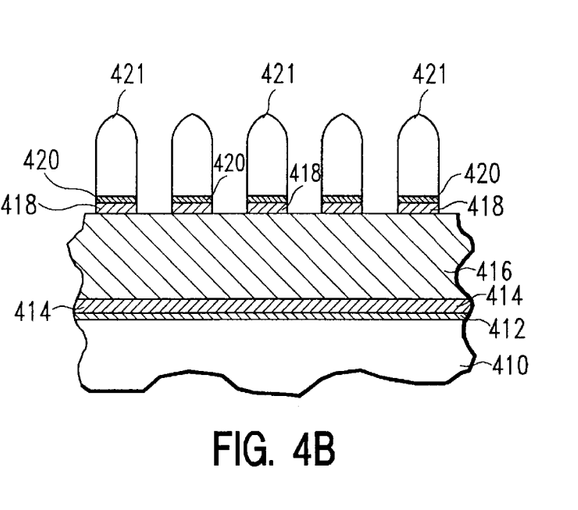
FIGS. 4B and 4C illustrate the Example Four and Example Five stack cross-sectional view schematic as the etch stack shown in FIG. 4A progresses through the etch process, including one step for etching the silicon oxynitride and a second titanium nitride barrier layer, and at least one etch step for etching an aluminum layer, a first titanium nitride barrier layer, and a first titanium wetting layer.
Figure 4C:
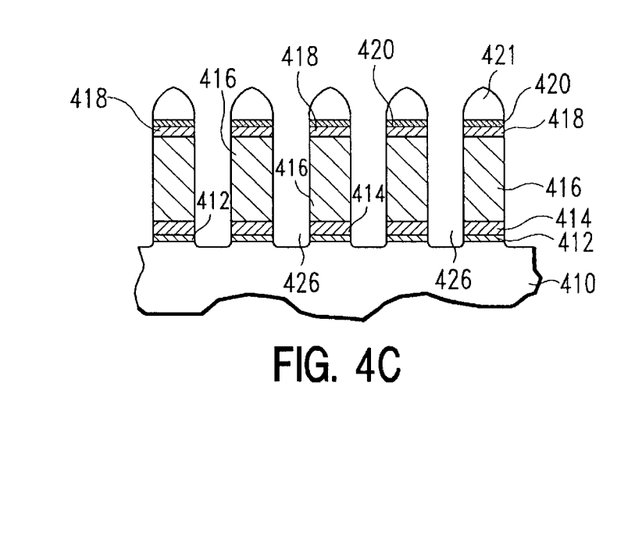

This Example can be illustrated using FIGS. 4A, 4B, and 4C, where FIG. 4A illustrates the schematic cross-sectional profile of the preferred embodiment stack 400. In particular, the substrate 410 is a layer of silicon dioxide overlying a silicon wafer surface (not shown). The barrier layer is a bilayer composed of a 1000 Å thick layer of titanium 412, followed by a 250 Å thick layer of titanium nitride 414. Overlying titanium nitride barrier layer 414 is a 3000 Å thick layer 416 of aluminum alloy containing 0.5% copper. Overlying aluminum alloy layer 416 is a second 300 Å thick layer of titanium nitride 418. Overlying second titanium nitride layer 418 is a layer of silicon oxynitride 420, having a thickness of about 250 Å. Overlying silicon oxynitride layer 420 is a layer of patterned DUV photoresist 421 having a thickness 424 of about 9000 Å, where the pattern is lines and spaces, and where the lines and spaces have a varying width 422 of about 0.25 μm and larger. The DUV photoresist was similar to that used in the initial set of experiments described above.

FIG. 4B shows the schematic of the cross-sectional profile of the etch stack after the first etch step, in which the pattern is transferred from DUV photoresist layer 421 through silicon oxynitride layer 420, second titanium nitride barrier layer 418, stopping at the upper surface of aluminum layer 416. The etch conditions used to carry out this first etch step were as follows: the source power was 1500 W; the bias power was 50 W; the process chamber pressure was 8 mTorr; the substrate support platen temperature was 40° C.; the gas flow rates were 10 sccm of $CHF_3$ and 90 sccm of $Cl_2$; and the wafer back side helium pressure was 12 Torr, with a typical leak of about 3 to 6 sccm. The etch time was 20 seconds.

FIG. 4C shows the schematic of the cross-sectional profile of the stack after the aluminum etch steps in which the pattern is transferred through aluminum layer 416, first titanium nitride layer 414, and first titanium layer 412, stopping with a slight over-etch 426 into silicon dioxide layer 410. The aluminum etching was performed using $Cl_2$ and $BCl_3$ as the main etchant gases, and using process conditions known in the art for etching aluminum. Nitrogen and argon gases may be used in combination with $Cl_2$ and $BCl_3$ to provide process control.

EXAMPLE FIVE

In this Example, the $SiO_xN_y$ ARC layer and the underlying titanium nitride barrier layer are etched in a single step. The aluminum layer and titanium nitride and titanium layers which underlie the aluminum layer are etched in a multi-step etch process, which typically includes at least two steps—a main etch step and an over-etch step.

This Example may also be illustrated using FIGS. 4A, 4B, and 4C, where FIG. 4A illustrates the schematic cross-sectional profile of the preferred embodiment stack 400. In particular, the substrate 410 is a layer of silicon dioxide overlying a silicon wafer surface (not shown). The barrier layer is a bilayer composed of a 150 Å thick layer of titanium 412, followed by a 800 Å thick layer of titanium nitride 414. Overlying titanium nitride barrier layer 414 is an 8000 Å thick layer 416 of aluminum alloy containing 0.5% copper. Overlying aluminum alloy layer 416 is a second 700 Å thick layer of titanium nitride 418. Overlying second titanium nitride layer 418 is a layer of silicon oxynitride 420, having a thickness of about 270 Å. Overlying silicon oxynitride layer 420 is a layer of patterned DUV photoresist 421 having a thickness 424 of about 6000 Å, where the pattern is lines and spaces, and where the lines and spaces have a varying width 422 of about 0.25 μm and larger. The DUV photoresist was similar to that used in the initial set of experiments described above.

FIG. 4B shows the schematic of the cross-sectional profile of the etch stack after the first etch step, in which the pattern is transferred from DUV photoresist layer 421 through silicon oxynitride layer 420, second titanium nitride barrier layer 418, stopping at the upper surface of aluminum layer 416. The etch conditions used to carry out this first etch step were as follows: the source power was 1400 W; the bias power was 70 W; the process chamber pressure was 8 mTorr; the substrate support platen temperature was 35° C.; the gas flow rates were 10 sccm of $CF_4$ and 90 sccm of $Cl_2$; and the wafer back side helium pressure was 12 Torr, with a typical leak of about 3 to 6 sccm. The etch time was 25 seconds.

FIG. 4C shows the schematic of the cross-sectional profile of the stack after the aluminum etch steps in which the pattern is transferred through aluminum layer 416, first titanium nitride layer 414, and first titanium layer 412, stopping with a slight over-etch 426 into silicon dioxide layer 410. The aluminum etching was performed using $Cl_2$ and $BCl_3$ as the main etchant gases, using process conditions known in the art for etching aluminum. Nitrogen and argon gases may be used in combination with $Cl_2$ and BCl3 to provide process control.

The above-described preferred embodiments are not intended to limit the scope of the present invention, as one skilled in the art can, in view of the present disclosure expand such embodiments to correspond with the subject matter of the invention claimed below.

We claim:

1. A method of plasma etching a silicon oxynitride-comprising layer in a semiconductor film stack, said method comprising: using an etchant gas mixture comprising chlorine and at least one compound comprising fluorine and carbon, wherein the atomic ratio of fluorine to chlorine in said etchant gas ranges between about 3:1 and about 0.01:1.

2. The method of claim 1, wherein said silicon oxynitride-comprising layer includes an oxide capping layer.

3. The method of claim 1, wherein s aid atomic ratio of fluorine to chlorine in said etchant gas ranges between about 0.5:1 and about 0.01:1.

4. The method of claim 3, wherein said atomic ratio of fluorine to chlorine in said etchant gas ranges between about 0.25:1 and about 0.1:1.

5. The method of claim 1 or claim 2 or claim 3, wherein said etchant gas forms a fluorine-comprising polymer or species which deposits on exposed surfaces adjacent to said silicon oxynitride-comprising layer in an amount sufficient to reduce the etch rate of said adjacent material while permitting the etching of said silicon oxynitride-comprising layer.

6. The method of claim 5, wherein a material having an exposed surface adjacent said silicon oxynitride-comprising layer comprises a photoresist.

7. The method of claim 6, wherein said photoresist is a DUV photoresist.

8. The method of claim 5, wherein said plasma etching is carried out in an apparatus which enables independent control of a plasma density and an ion bombardment energy of a substrate surface.

9. The method of claim 5, wherein said etchant gas mixture does not contain free oxygen.

10. The method of claim 1 or claim 2 or claim 3, wherein said etchant gas compound comprising fluorine and carbon is selected from the group consisting of $CHF_3$, $CF_4$, $CF_3Cl$, $C_2F_4$, $C_2F_6$, and combinations thereof.

11. The method of claim 10, wherein said etchant gas includes an assisting gas which is used to increase the rate of etching by controlling the rate of deposition of said fluorine-comprising polymer or species on said stack surface, wherein said assisting gas is selected from the group consisting of $F_2$, HF, HCl, $NF_3$, $SF_6$, and combinations thereof.

12. The method of claim 1 or claim 2 or claim 3, wherein said plasma etching is performed using a process chamber pressure within the range of about 2 mTorr and about 20 mTorr.

13. The method of claim 12, wherein said process chamber pressure is within the range of about 2 mTorr and about 12 mTorr.

14. The method of claim 13, wherein said process chamber pressure is within the range of about 2 mTorr and about 8 mTorr.

15. The method of claim 1 or claim 2 or claim 3, wherein said plasma etching is carried out in an apparatus which enables independent control of a plasma density and an ion bombardment energy of a substrate surface.

* * * * *